United States Patent
Benvegnu et al.

(10) Patent No.: US 11,699,595 B2
(45) Date of Patent: Jul. 11, 2023

(54) IMAGING FOR MONITORING THICKNESS IN A SUBSTRATE CLEANING SYSTEM

(71) Applicant: Applied Materials, Inc., Santa Clara, CA (US)

(72) Inventors: Dominic J. Benvegnu, La Honda, CA (US); Jun Qian, Sunnyvale, CA (US); Boguslaw A. Swedek, Morgan Hill, CA (US); Thomas H. Osterheld, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 76 days.

(21) Appl. No.: 17/185,876

(22) Filed: Feb. 25, 2021

(65) Prior Publication Data
US 2022/0270889 A1   Aug. 25, 2022

(51) Int. Cl.
 *B24B 37/005* (2012.01)
 *H01L 21/321* (2006.01)
 *B08B 7/00* (2006.01)

(52) U.S. Cl.
 CPC ........ *H01L 21/3212* (2013.01); *B08B 7/0035* (2013.01); *B24B 37/005* (2013.01)

(58) Field of Classification Search
 CPC ... H01L 21/3212; H01L 22/00; H01L 21/681; B08B 7/0035; B24B 37/005
 See application file for complete search history.

(56) References Cited

U.S. PATENT DOCUMENTS

| | | | |
|---|---|---|---|
| 5,909,276 A | * | 6/1999 | Kinney ............. G01N 21/94 356/336 |
| 6,500,051 B1 | | 12/2002 | Nishi et al. |
| 10,903,101 B2 | * | 1/2021 | Komatsu .......... H01L 21/67288 |
| 2002/0121290 A1 | | 9/2002 | Tang et al. |
| 2004/0086171 A1 | | 5/2004 | Jun et al. |
| 2005/0036671 A1 | * | 2/2005 | Watkins ............ G01N 21/9503 382/145 |
| 2006/0260653 A1 | | 11/2006 | Fishkin et al. |
| 2009/0044843 A1 | | 2/2009 | Shirazi |

(Continued)

FOREIGN PATENT DOCUMENTS

| | | |
|---|---|---|
| EP | 1016126 | 12/2018 |
| JP | 60-053017 | 3/1985 |
| TW | 202010003 | 3/2020 |

OTHER PUBLICATIONS

International Search Report and Written Opinion in International Appln. No. PCT/US2022/015374, dated May 23, 2022, 14 pages.

(Continued)

*Primary Examiner* — Binh X Tran
(74) *Attorney, Agent, or Firm* — Fish & Richardson P.C.

(57) ABSTRACT

A substrate cleaning system includes a cleaner module to clean a substrate after polishing of the substrate, a drier module to dry the substrate after cleaning by the cleaner module, a substrate support movable along a first axis from a first position in the drier module to a second position outside the drier module, and an in-line metrology station including a line-scan camera positioned to scan the substrate as the substrate is held by the substrate support and the substrate support is between the first position to the second position. The first axis is substantially parallel to a face of the substrate as held in by the substrate support.

14 Claims, 6 Drawing Sheets

(56) References Cited

U.S. PATENT DOCUMENTS

| | | |
|---|---|---|
| 2012/0305033 A1 | 12/2012 | Keigler et al. |
| 2017/0140525 A1 | 5/2017 | Benvegnu et al. |
| 2019/0076986 A1 | 3/2019 | Shigematsu |
| 2020/0202504 A1* | 6/2020 | Shchemelinin ......... G06T 5/003 |

OTHER PUBLICATIONS

Office Action in Taiwanese Appln. No. 111105416, dated Mar. 10, 2023, 10 pages (with English search report).

* cited by examiner

IMAGING FOR MONITORING THICKNESS IN A SUBSTRATE CLEANING SYSTEM

TECHNICAL FIELD

This disclosure relates to optical metrology, e.g., to detect the thickness of a layer on a substrate, and in particular to optical metrology in a system for cleaning and drying the substrate.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the metallic layer remaining between the raised pattern of the insulative layer form vias, plugs, and lines that provide conductive paths between thin film circuits on the substrate. For other applications, such as oxide polishing, the filler layer is planarized until a predetermined thickness is left over the non-planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

Variations in the slurry distribution, the polishing pad condition, the relative speed between the polishing pad and the substrate, and the load on the substrate can cause variations in the material removal rate. Various optical metrology systems, e.g., spectrographic or ellipsometric, can be used to measure the thickness of the substrate layer pre-polishing and post-polishing, e.g., at an in-line or stand-along metrology station. In addition, various in-situ monitoring techniques, such as optical or eddy current monitoring, can be used to detect a polishing endpoint.

SUMMARY

In one aspect, a substrate cleaning system includes a cleaner module to clean a substrate after polishing of the substrate, a drier module to dry the substrate after cleaning by the cleaner module, a substrate support movable along a first axis that is substantially parallel to a face of the substrate as held in by the substrate support from a first position in the drier module to a second position outside the drier module, and an in-line metrology station including a line-scan camera positioned configured to scan the substrate as the substrate is held by the substrate support and the substrate support is moving between the first position to the second position.

In another aspect, a polishing system includes a polishing station to polish a substrate, a cleaner module to clean the substrate after polishing at the polishing station, a drier module to dry the substrate after cleaning at the cleaning module, a housing to separate the cleaner module and drier module from other modules of a polishing apparatus, one or more robots to move the substrate from the polishing station to the cleaner module and from the cleaner module to the drier module, a support to hold the substrate, an in-line metrology station to measure the substrate after polishing of a top surface of the substrate in the polishing station, and a controller configured to receive data from the camera, to generate a two-dimensional image from the data, and to control polishing at the polishing station based on the two-dimensional image. The support is attached to a first motor, the first motor is configured to cause a relative motion between the support and the drier module along a first axis, and a top surface of the substrate faces along a second axis. The in-line metrology station has a line-scan camera having detector elements secured outside the housing, a light source, and an optical train to direct light from the light source to the substrate at a non-zero incidence angle during scanning of the substrate and direct light reflected from the substrate to the line-scan camera.

In another aspect, a polishing system includes a polishing station to polish a substrate, a cleaner module to clean the substrate after polishing at the polishing station, a drier module to dry the substrate after cleaning at the cleaning module, a housing to separate the cleaner module and drier module from other modules of a polishing apparatus, one or more robots to move the substrate from the polishing station to the cleaner module and from the cleaner module to the drier module, a support to hold the substrate, an in-line metrology station to measure the substrate after polishing of a top surface of the substrate in the polishing station, and a controller configured to receive a data from the camera, to generate a two-dimensional image from the data, and to control polishing at the polishing station based on the image. The support is attached to a first motor, the first motor is configured to cause a relative motion between the support and the drier module along a first axis, and a top surface of the substrate faces along a second axis. The in-line metrology station has a line-scan camera having detector elements secured outside the housing, a light source located outside the housing and configured to direct light into the cleaner module through a window mounted on the housing, and an optical train to direct light from the light source to the substrate at a non-zero incidence angle during scanning of the substrate and direct light reflected from the substrate to the line-scan camera.

Implementations can include, but are not limited to, one or more of the following potential advantages.

The described techniques can improve polishing throughput because the substrate is scanned during a time that it would be moving out of a cleaner module (even without the metrology), and the substrate does not need to be placed in a stationary position or moved to a separate metrology module. Variations of substrate thickness, and/or unacceptable non-uniformity can be detected by the in-line metrology station while the substrate is moving in the drier module. In addition, the described techniques can integrate one or more in-line metrology stations with the substrate cleaning system to further improve throughput, particularly when the drier module of the cleaning system has more than one track, e.g., dual tracks.

The described techniques can reduce the total space needed for the polishing system by incorporating one or more in-line metrology stations after the drier module, at least partially arranged inside the housing of the cleaning system. That is, the described techniques can reduce the footprint needed for a polishing system in a cleanroom.

The details of one or more implementations are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

By taking an image of a substrate before or after the substrate is polished, an in-line optical metrology system can determine the thickness of respective regions of a layer on the substrate. Conventionally, an in-line optical metrology system is positioned inside a factory interface unit. A robot in the factory interface unit moves the substrate past a sensor of the metrology system located in the factory interface unit. A potential problem is that the factory interface unit robot is also needed to move substrates between cassettes and the polishing tool or cleaning tool. Consequently, time spent by the factory interface unit robot in moving the substrate to or through the in-line metrology system can impact overall substrate throughput. However, one or more optical metrology systems can be integrated into a substrate cleaning system, particularly into a drier module of the system. The optical metrology systems can measure the substrate as the substrate is being inserted into or extracted from a cleaner or drier module. This permits measurements to be conducted substantially without impacting system throughput.

Figure 1A:
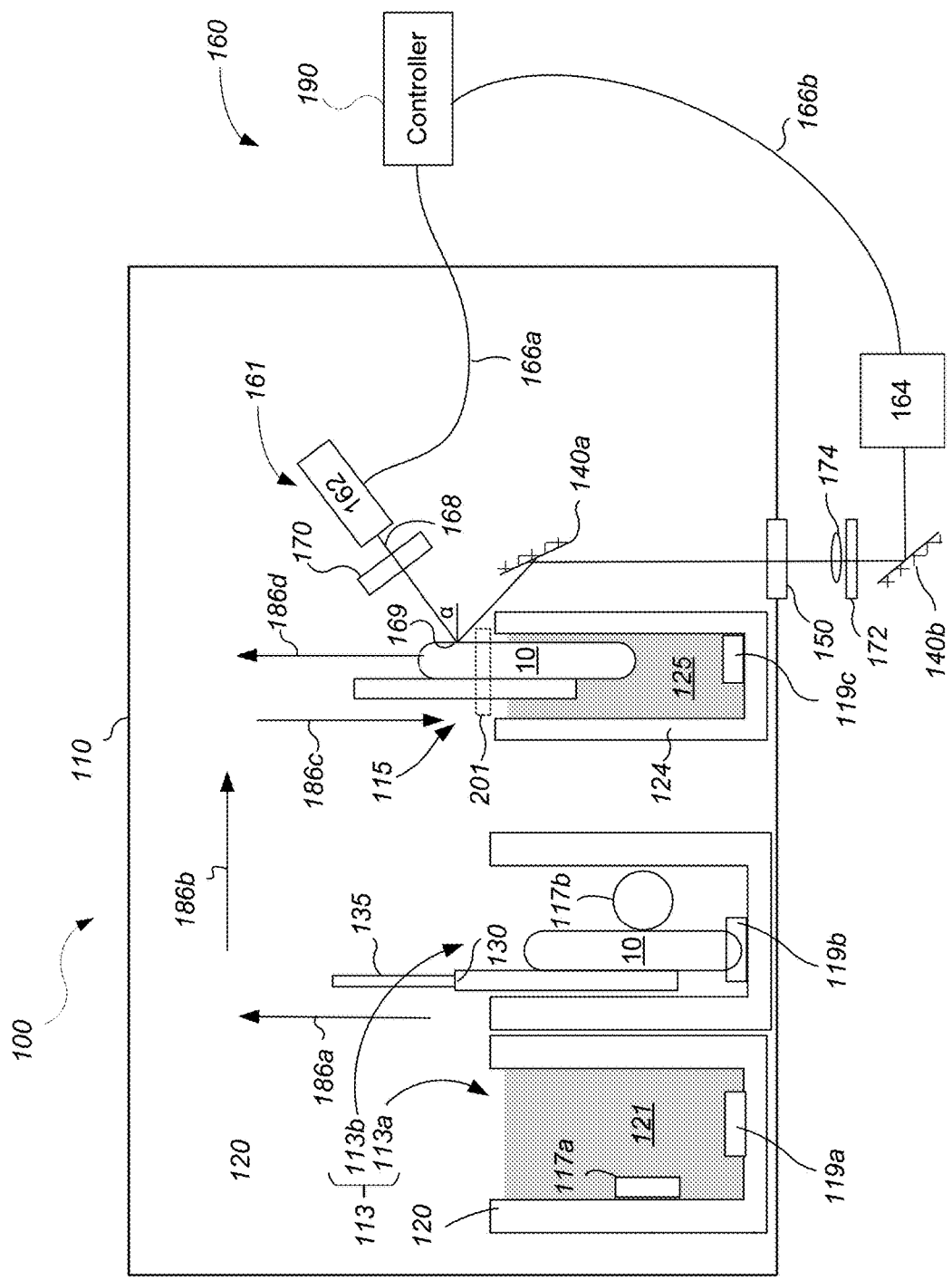
FIG. 1A illustrates a view of an example of a substrate cleaning system with an in-line optical metrology system with a stationary sensor assembly.

Referring to FIG. 1A, a substrate cleaning system 100 includes a housing 110 that can accommodate one or more cleaner modules 113 and a drier module 115. The drier module 115 can be positioned next to one of the cleaner module 113. For example, the cleaner modules 113 and drier modules 115 can be arranged along a linear path. The cleaning system 100 also includes an optical metrology system 160, e.g., a color imaging system, arranged partially inside the housing. The optical metrology system 160 can be incorporated with the drier module. The housing 110 is also used to separate the cleaner module and drier module from other modules of a polishing apparatus, e.g., the polishing tool and the factory interface module.

As shown in FIG. 1A, the cleaning system 100 includes one or more cleaner modules 113, e.g., a first cleaner module 113a and a second cleaner module 113b. The cleaning system 100 also includes a drier module 115.

Each of the one or more cleaning modules can be a sulfuric peroxide mixture (SPM) cleaner, a megasonic cleaner, or a brush or buffing cleaner. During the cleaning processes, one or more solvents can be applied to the substrate. For example, solvents can be sprayed onto the substrate during brush or buff cleaning, or solvents can be included in the bath of a megasonic cleaner. The one or more solvents can dissolve or remove residual solids, e.g., abrasive particles or organic materials from the polishing pad or slurry, on the substrate surface after polishing. Possible solvents include acetone, methanol, ammonium hydroxide, and sulfuric hydrogen peroxide.

Briefly, the SPM cleaner can include a cleaning tank holding a liquid sulfuric peroxide mixture and a rinse tank holding a rinsing liquid to remove the SPM. The megasonic cleaner can include a tank holding a cleaning fluid and one or more transducers which are configured to generate vibrations in the cleaning fluid at high frequencies. The brush or buffing cleaner can include one or more rollers or pads to remove polishing residue.

As shown in FIG. 1A, the first cleaner module 113a is a megasonic module and the cleaner module 113b is a brush cleaner, but this is simply exemplary. The megasonic module 113a includes a tank 120 to hold a cleaning liquid 121 and a transducer 117a that is configured to emit megasonic energy into the cleaning liquid 121 to clean the substrate. In some implementations, the megasonic cleaner module can include a rotation mechanism to rotate the substrate to further facilitate the cleaning process. The brush module 113b includes a brush 117b, e.g., a brush roller, that is configured to move vertically, or rotate, or both while pressed onto the substrate to remove debris from the substrate.

Even though there are only two cleaner modules illustrated in FIG. 1A for the ease of illustration, three or more cleaner modules can be deployed in the cleaning system 100. Each of the cleaner modules 113a, 113b includes a support 119a, 119b, respectively. The supports are configured to receive the substrate in a vertical orientation for cleaning.

The cleaning system 100 also includes a substrate transfer system, such as a walking robot arm 135 with a substrate support, e.g., an end effector 130, to move the substrate between the cleaner and drier modules. The end effector 130 can be a hand that contacts and applies suction to the back of the substrate 10, or an edge gripping mechanism. The walking robot arm 135 can grip the substrate with the end effector 130 to move the substrate vertically towards or away from the cleaner modules.

A controller 190 for the cleaning system 100 can cause the walking robot arm 135 to move the substrate in a pre-programmed manner along a path 186. In particular, after the substrate 10 is transferred to the cleaning system 100 from other modules in a polishing apparatus, the walking robot arm 135 secures an edge portion of the substrate 10, e.g., with the end effector 130, and moves the substrate 10 along a first portion of the path 186 into the cavity of the first cleaner module 113a. In some implementations, the walking robot arm 135 holds and moves the substrate vertically, i.e., the flat face of the substrate is normal to gravity. After the walking robot arm 135 moved the substrate substantially inside the cavity, the end effector 130 disengages and releases the substrate from the walking robot arm 135 on to a first support 119a. After a pre-determined amount of time or reaching certain criteria indicating an end of the cleaning process for the cleaner module 113a, the walking robot arm 135 re-engage the substrate 10 through the end effector 130 to pick up the substrate and to vertically move the substrate away from the first cleaner module 113a.

Then the robot arm 135 repeats the process to clean the substrate 10 in a second cleaner module 113b along the path 186 by releasing the substrate 10 onto the second support 119b and then picking up the substrate and transporting the substrate 10 vertically out of the second cleaner module 113b along the path 186.

The walking robot arm 135 repeats the above-mentioned process until the cleaning process is finished for the substrate in the last cleaner module, i.e., the substrate has been cleaned through each of the cleaner modules. In general, the robot arm 135 lifts the substrate 10 vertically out of the cleaner module (shown by arrow 186a), moves the substrate horizontally to a position above the next cleaner module or drier module (shown by arrow 186b), and lowers the substrate into the next module (shown by arrow 186c). These operations can be performed with the substrate in a vertical orientation.

The drier module 115 dries the substrate 10. The drier module 115 includes a tank 124 to hold a rinse bath 125. Either as part of the tank 124 or supported above the tank 124 is a drier 201, e.g., a Marangoni drier. The walking robot 135 delivers the substrate vertically into the tank 124 of the drier module 115 along the path 186c. The robot arm 135 releases substrate 10 onto a support 119c in the tank of the drier module. The substrate sits in the rinse bath 125 in the drier module 115. The rinse bath 125 can be deionized (DI) water, but the rinse bath 125 can also include cleaning chemistry, e.g., an acid or base, such as HCL acid, HF acid, an organic alkaline, tetramethylammonium hydroxide (TMAH), ammonium hydroxide, another pH adjuster, or the like. The cleaning chemistry in the rinse bath 125 can further clean the substrate and facilitate the drying process.

Figure 3:
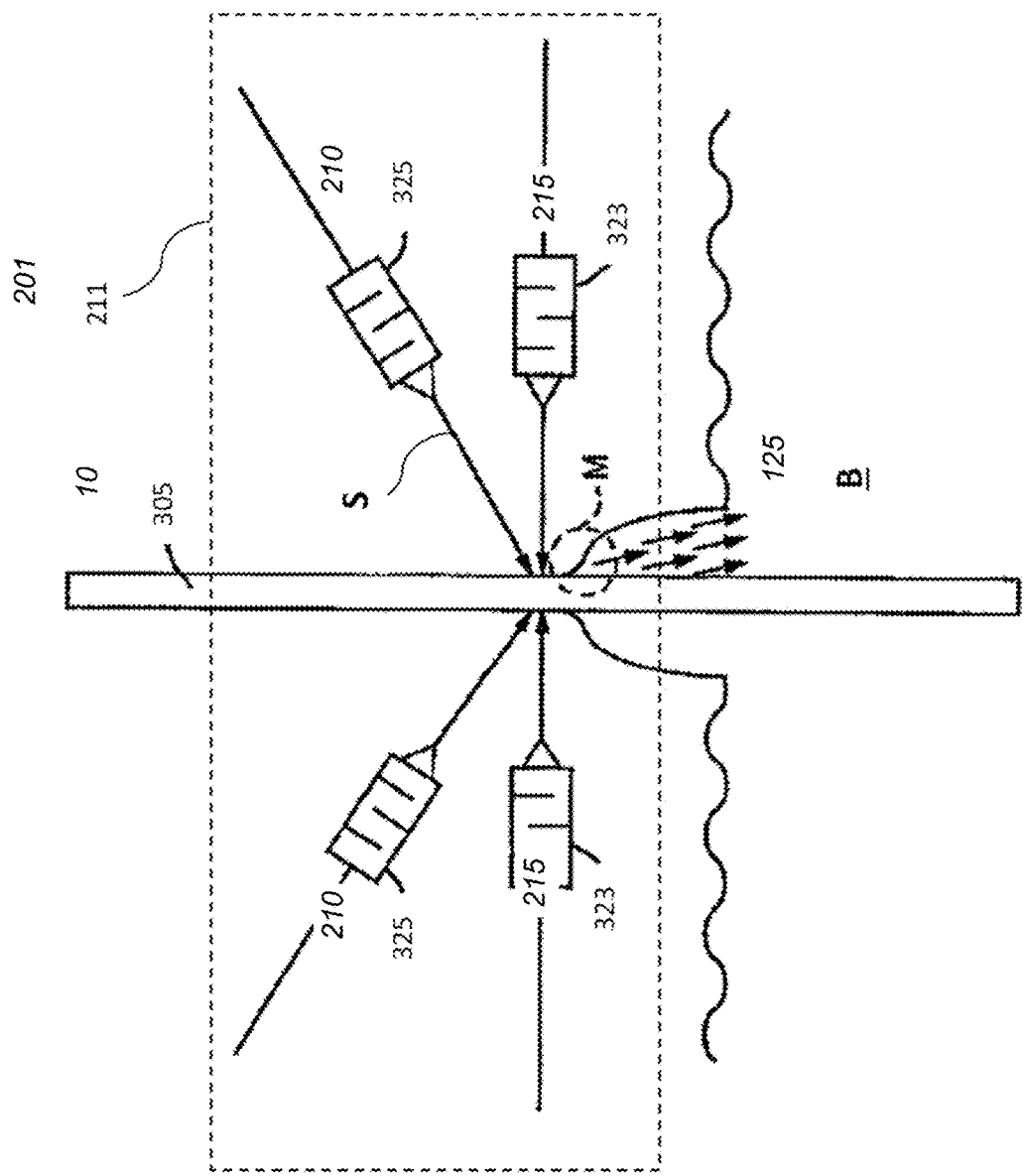
FIG. 3 is a close-up view of a substrate and nozzles positioned within a drier.

Referring to FIG. 3, in a Marangoni drier a solvent (S), e.g., liquid or vaporous isopropyl alcohol (IPA), that is miscible with the rinse bath 125 is introduced to a fluid meniscus (M) which forms as the substrate 10 is lifted from the bath or as the bath fluid is drained past the substrate 10. The solvent is absorbed along the surface of the fluid, with the concentration of the solvent being higher at the tip of the meniscus. The higher concentration of solvent causes surface tension to be lower at the tip of the meniscus than in the bulk of the bath fluid, causing bath fluid to flow from the drying meniscus toward the bulk bath fluid 125. Such a flow is known as a "Marangoni" flow, and can be employed to achieve substrate drying without leaving streaks, spotting, or bath residue on the substrate.

As one example, the drier module 115 can also include solvent sources 210, e.g., nozzles that can apply at least one solvent for drying the substrate. The solvent can be a vapor, e.g., vaporous isopropyl alcohol (IPA). The solvent can be applied as the walking robot arm 135 moves the substrate vertically out of the drier module 115. The solvent sources 210 are located above the free surface of the rinse bath. The solvent sources 210 are configured to spray the at least one solvent on to at least one of the front or back surface of the substrate. The solvent sources 210, e.g., the nozzles, preferably are positioned so that the solvent vapor will be absorbed by the rinsing liquid of the bath fluid 125 at an air/substrate/rinsing liquid interface, and the interface preferably forms a meniscus (as enclosed by the dashed circle "M" in FIG. 3). Alternatively, the solvent can be supplied in liquid form into the tank 124 to form a liquid film on top of the bath fluid. In addition, an optional rinsing liquid supply that has one or more rinsing fluid nozzles 215 can be positioned to spray the rinsing liquid across the entire horizontal diameter of the substrate 10 as the substrate 10 is lifted from the tank 124 into the drier 201.

In some implementations, the substrate can be configured to rotate, due to the rotation mechanism, while sitting inside the support 119c to further facilitate the drying process. The rotation mechanism can control the speed or momentum for rotating the substrate.

Alternatively or in addition, the drier module 115 includes a nozzle or aperture connected to an air source to generate an air jet onto the substrate. In some implementations, the air jet creates laminate airflow across the substrate. The laminate airflow can accelerate the evaporation of the residual solvent from the substrate surface and carry the solvent gas away in order to dry the substrate.

Returning to FIGS. 1A-2B, the walking robot arm 135 can be operated to lift the substrate vertically out of the drier module along the path 186d as the substrate is being dried by the drier module. In some implementations, the polishing system includes one or more separate actuators to move the substrate out of the drier module. For example, the walking robot arm 135 can be used to place the substrate 10 into the tank 124, and a separate robot can be used to lift the substrate out of the tank.

In general, the system can measure a thickness profile of the substrate while the substrate 10 is being lowered vertically into the drier module 115 along path 186c, or while the substrate is being lifted vertically out of the drier module along path 186d. "Vertically" in this context includes up to 20° off of gravity. More specifically, the substrate 10 can be vertically lowered or raised from a first position to a second position, e.g., from a first position above the bath 125 to a second position in the bath 125, or from a first position in the bath 125 to a second position above the bath 125.

The in-line optical metrology system 160 can take advantage of the substrate motion along the path 186c or 186d to measure the thickness profile of the substrate. In particular, the optical metrology system 160 can direct a light beam 168 to impinge and be reflected from the substrate 10 at a position 169 that the substrate 10 travels through when being transported from the first position to the second position. The position 169 can be above the tank 124, e.g., above the drier 201 as shown in FIG. 1.

The in-line optical metrology system 160 can include a sensor assembly 161, a controller 190 configured to receive measurements from the sensor assembly 161.

The controller 190, such as a programmable computer, is connected to each motor to independently control the motion of the driving mechanism 135, i.e., robot arms, the rollers 117, the detector 164, and the light source 162. The controller 190 can include a central processing unit (CPU), a memory, and support circuits, e.g., input/output circuitry, power supplies, clock circuits, cache, and the like. The memory is connected to the CPU. The memory is a non-transitory computable readable medium, and can be one or more readily available memory such as random access memory (RAM), read-only memory (ROM), floppy disk, hard disk, or other forms of digital storage. In addition, although illustrated as a single computer, the controller 190 could be a distributed system, e.g., including multiple independently operating processors and memories.

The sensor assembly 161 can include a light source 162, a light detector 164, and circuitry 166 for sending and receiving signals between the controller 190 and the light source 162 and light detector 164. The light source can generate a light beam 168 that is directed to the substrate 10, and reflections of the light beam of the substrate 10 are directed to the light detector 164. One or more optical components, e.g., mirrors 140a, 140b, can be used to set the path of the light beam. The circuitry 166 includes a control line 166a to turn on or off the light source 162, and another control or data line 166b to receive a signal from the light detector 164.

Some components of the sensor assembly 161, particularly the detector 164, can be located outside the drier module 119c, and in particular outside the housing 110 of the cleaning system 100. For example, the light source 162 and the one or more mirrors 140a, 140b can be located inside the housing 110 of the cleaning system 100, and the light detector 164 can be located outside the housing 110. A window 150 through a wall of the housing 110 can be used to transmit the light beam out of the housing 110 to the light detector 164.

By analyzing the received light beam from the light detector 164, the controller 190 is configured to generate a measured thickness profile for the substrate when it is lowered into the drier module or raised up away from the drier module.

The light source 162 can be operable to emit white light. In one implementation, the white light emitted includes light having wavelengths of 200-800 nanometers. A suitable light source is an array of white-light emitting diodes (LEDs), or a xenon lamp, or a xenon mercury lamp. The light source 162 is oriented to direct light 168 onto the exposed surface of the substrate 10 at a non-zero angle of incidence α. The angle of incidence α can be, for example, about 30° to 75°, e.g., 50°.

The light source 162 can illuminate a substantially linear elongated region that spans the width of the substrate 10. The light source 162 can include optics, e.g., a beam expander, to spread the light from the light source into an elongated region. Alternatively or in addition, the light source 162 can include a linear array of light sources. The light source 162 itself, and the region illuminated on the substrate, can be elongated and have a longitudinal axis parallel to the surface of the substrate.

A diffuser 170 can be placed in the path of the light 168, or the light source 162 can include a diffuser, to diffuse the light before it reaches the substrate 10.

The detector 164 is a color camera that is sensitive to light from the light source 162. In general, the detector 164 can be any proper camera that includes at least an array of detector elements. For example, the camera can include a CCD array. In some implementations, the array is a single row of detector elements. For example, the camera can be a line-scan camera, which can avoid perspective distortion from using a conventional 2D camera. The row of detector elements can extend parallel to the longitudinal axis of the elongated region illuminated by the light source 162. Where the light source 162 includes a row of light-emitting elements, the row of detector elements can extend along an axis parallel to the longitudinal axis of the light source 162. Alternatively, the detector elements extend vertically away from the surface of the camera 164. A row of detector elements can include 1024 or more elements.

The camera 164 is configured with appropriate focusing optics 172 to project a field of view of the substrate onto the array of detector elements. The field of view can be long enough to view the entire width of the substrate 10, e.g., 150 to 300 mm long. The camera 164, including associated optics 172, can be configured such that individual pixels correspond to a region having a length equal to or less than about 0.5 mm. For example, assuming that the field of view is about 200 mm long and the detector 164 includes 1024 elements, then an image generated by the line-scan camera can have pixels with a length of about 0.5 mm. To determine the length resolution of the image, the length of the field of view (FOV) can be divided by the number of pixels onto which the FOV is imaged to arrive at a length resolution.

The camera 164 can be also configured such that the pixel width is comparable to the pixel length. For example, an advantage of a line-scan camera is its very fast frame rate. The frame rate can be at least 5 kHz. The frame rate can be set at a frequency such that as the imaged area scans across the substrate 10, the pixel width is comparable to the pixel length, e.g., equal to or less than about 0.3 mm.

In some implementations as shown in FIG. 1A, the optical components are generally fixed during scanning. In this case, scanning of the field of view of the line-scan camera across the substrate is provided by motion of the substrate by the robot, e.g., the walking robot arm 135, that lowers the substrate 10 into the drier 115, or by the walking robot arm 135 or another actuator (not shown) that lifts the substrate and substrate support out of the drier 115.

Figure 1B:
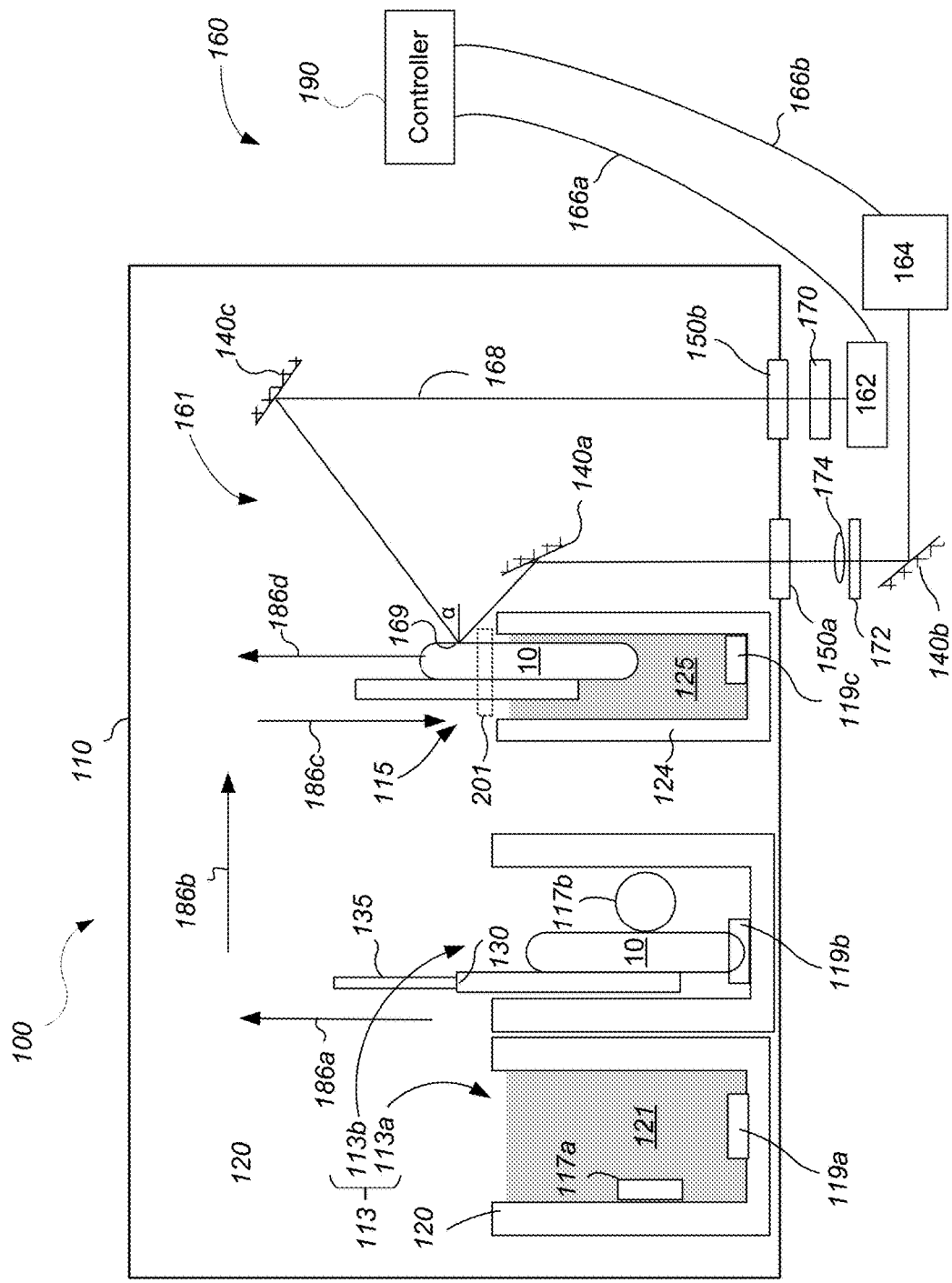
FIG. 1B illustrates a view of an example of a substrate cleaning system with an in-line optical metrology system with a stationary sensor assembly with the light source outside the chamber.

FIG. 1B illustrates a view of an example of a substrate cleaning system 100 with an in-line optical metrology system 160 with a stationary sensor assembly 161 with the light source 162 outside the chamber.

In this configuration, both light source 162 and light detector 164 are located outside the housing 110 of the system 100. The housing 110 can include one or more mirrors 150a and 150b to transmit light beam in and out of the housing 110. The light path for this configuration is shown in FIG. 1B.

In some implementations for measuring a thickness profile of the substrate 10 when the actuator is vertically raising up the substrate away from the drier module 115 along path 186d, the controller 190 cause the light source 162 to first emit a light beam 168 that passes through the window 150b into the housing 110. The first mirror 140c located inside the housing 110 reflects the light beam 168 from the window 150b onto position of impingement 169 of the top surface of the substrate 10 at an incidence angle α. The top surface of the substrate 10 reflects the light beam towards the second mirror 140a located inside the housing 110. The second mirror 140b reflects the light beam 168 after receiving it from the substrate to pass through the window 150a. The third mirror 140b receives the light beam from the window 150 and reflects it into the detector 164. Then the detector 164 sends signals representing the received light beam into controller 190. During the substrate being moved by the walking robot arm 135 away from the drier module inside the housing, the stationary sensor assembly 161 scans at least a portion of regions in the substrate through the above-noted light path to determine the thickness of regions in the substrate 10.

Figure 2A:
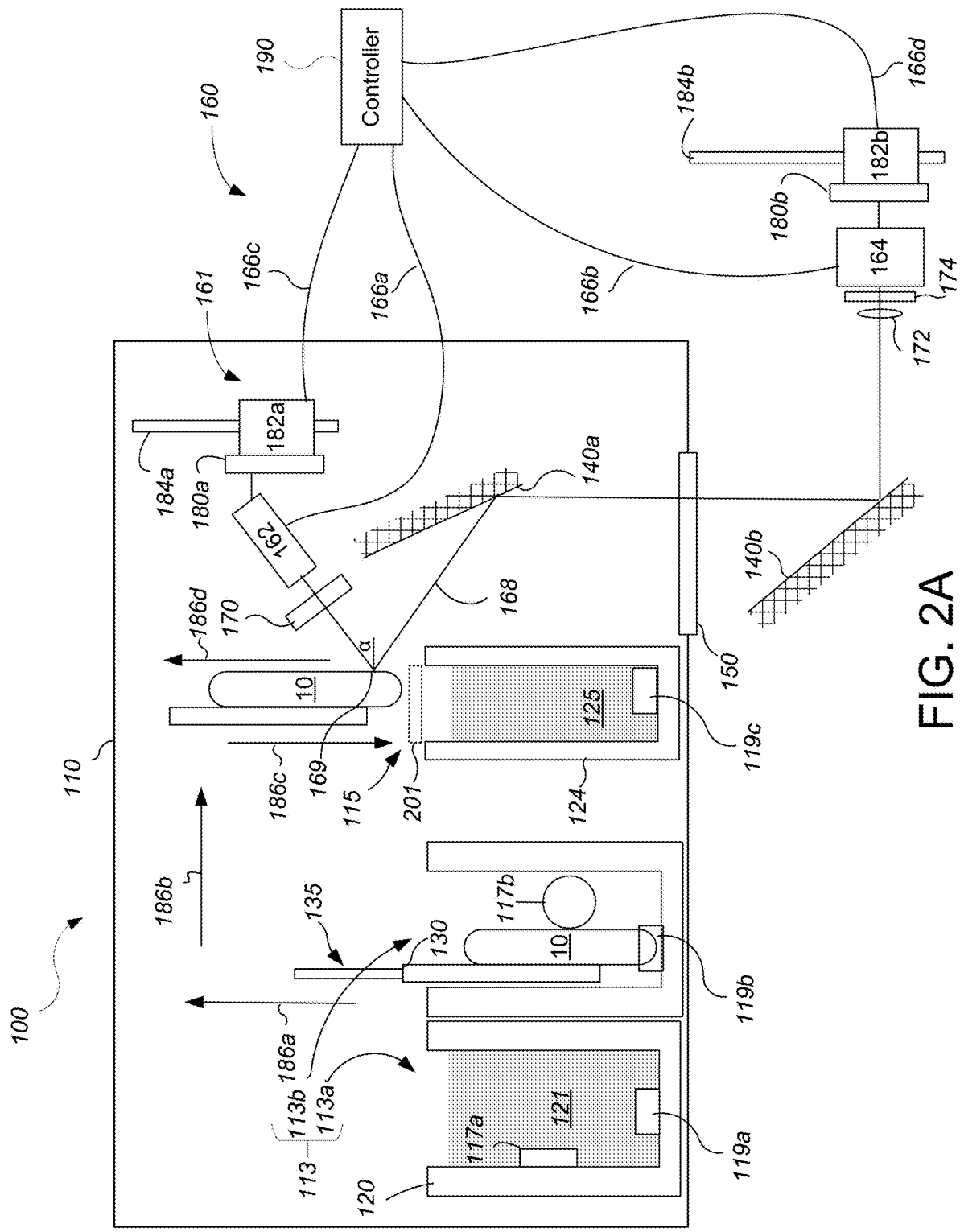
FIG. 2A illustrates a view of an example of a substrate cleaning system with an in-line optical metrology system with a movable sensor assembly.

Alternatively, as shown in FIG. 2A, the light source 162 and the light detector 164 can be supported on respective movable stages 180a, 180b. That is, the light source 162 is supported by a stage 180a, and the light detector 164 is supported by another stage 180b. The light source 162 and the light detector 164 are movable relative to the substrate 10 such that the imaged area can scan across the length of the substrate. In this configuration, the substrate 10 is scanned while the substrate 10 is being supported stationary above the bath 125, e.g., above the drier 201.

In some implementations, the stages 180 are configured to move during image acquisition. For example, the motion of the stages 180 can be coordinated with the motion of the substrate along the path 186c or 186d to provide a desired linear scan speed of the imaging area across the substrate 10. The desired scan speed can be set by the frame rate of the detector 164, e.g., the line scan camera. If the substrate motion provided by the walking robot arm 135 is not fast enough compared to the required scanning speed, the controller can cause the stages 180 to move such that the position 169 of impingement moves in a direction opposite the direction of motion of the substrate motion to increase a relative speed between the sensor assembly and the substrate to meet the scanning speed requirement. If the substrate motion provided by the walking robot arm 135 is too fast, i.e., faster than the scanning capability of the in-line camera 164, then the controller can cause the stages 180 to move such that the position 169 of impingement move in the same direction as the direction of the substrate motion, but slower so as to decrease the relative speed between the substrate and the sensor assembly to accommodate the measuring capability.

In general, the motion of both stages 180a and 180b are controlled by the controller 190 according to the scanning process feedbacks. To determine whether the scanning speed is compatible with the substrate motion, the controller 190 analyzes the obtained optical data or signals from the detector and compares a scanning quality against certain ground-truth data or criteria preset by the user or internally by the sensor assembly 161.

The circuitry 166 includes control lines 166c and 166d connecting the controller 190 to the motors 182a and 182b respectively. The controller 190 can send signals representing the velocity or acceleration of each motor 182 to control the motion of the light source 162 and the detector 164. The controller 190 can send control signals to the light source 162 through the control line 166a to control the light characteristics emitted from the light source. For example, the controller 190 can control the light intensity, color, and width. In some implementations, the control or data line 166b is configured to transfer data representing light received by the detector 164 to the controller 190 for analysis. Alternatively, the light detector 164 can pre-process the data representing the received light into an image and send data representing the image to the controller through the control line 166b.

The sensor assembly 161 can include a mechanism to adjust vertical distance between the substrate 10 and the light source 162 and detector 164. For example, the sensor assembly 161 can include an actuator to adjust the vertical or horizontal position of the stage 180a or 180b. Besides, the mechanism can further adjust the orientation angle of the light source 162 and the detector 164 independently. In some implementations, the light emitted from the light source can form a light path that is substantially parallel to the light path formed by the reflected light received by the detector.

In general, the light path in the sensor assembly can be configured as follows. The light source 162 first emits a light beam with an incident angle α towards the top surface of the substrate 10. The light beam can also pass the diffuser 170 between the light source 162 and the substrate 10. The light beam is reflected, or deflected, or both, by the top surface of the substrate according to the incidence angle α. Then the first mirror 140a reflects the light beam reflected from the substrate 10 onto a second mirror 140b through a window 150 located on the surface of the housing 110. The detector 164 is configured to receive the reflected light beam from the second mirror 140b and to send signals representing the received light beam to the controller 190.

Figure 4:
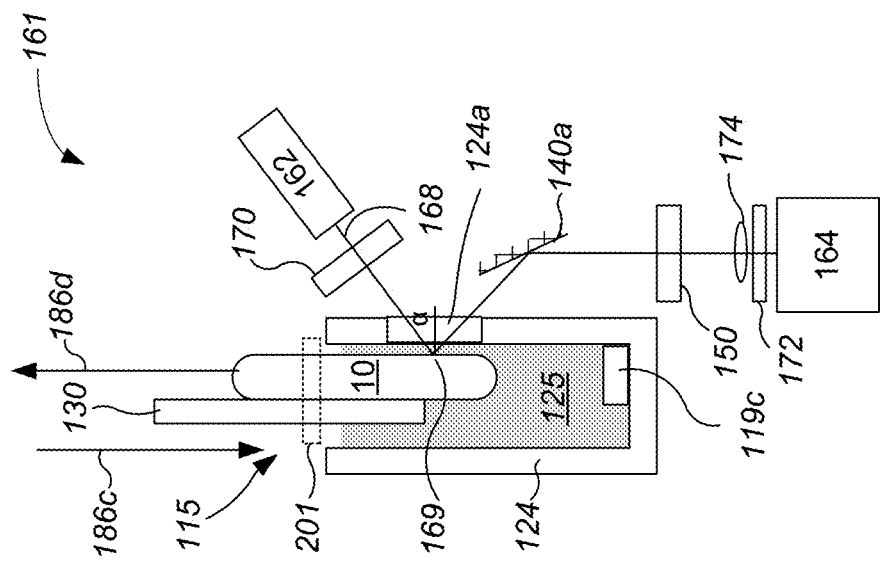
FIG. 4 illustrates a view of another example of a drier module with an in-line optical metrology system.

Referring to FIG. 4, in some implementations, the in-line optical metrology system 160 measures a thickness profile of the substrate 10 while the substrate is substantially inside the bath 125 in the drier module. For example, tank 124 of the drier module 115 can be at least partially translucent or transparent. Alternatively, a window 124a can be formed in the wall of the tank. The light beam 168 is directed through the wall or window in the tank and the bath 125 to impinge the surface of the substrate 10, and then the reflected light beam passes back through the wall or window in the tank to reach the detector 164.

Optionally a polarizing filter 174 can be positioned in the light path, e.g., between the substrate 10 and the detector 164. The polarizing filter 174 can be a circular polarizer (CPL). A typical CPL is a combination of a linear polarizer and quarter-wave plate. Proper orientation of the polarizing axis of the polarizing filter 174 can reduce haze in the image and sharpen or enhance desirable visual features.

Assuming that the outermost layer on the substrate is a semitransparent layer, e.g., a dielectric layer, the color of light detected at detector 164 depends on, e.g., the composition of the substrate surface, substrate surface smoothness, and/or the amount of interference between light reflected from different interfaces of one or more layers (e.g., dielectric layers) on the substrate.

The controller 190, as noted above, can be configured to analyze the thickness of regions in a substrate based on the received signals connected to a computing device.

To process the received signals, the controller 190 is configured to assemble one or more images from the received signals representing different colors, i.e., red, green, and blue, from respective detector elements. The controller can process the image based on the received signals by offsetting or gaining the intensity values of the image in each color channel independently. The controller can also normalize the image based on a reference image. The controller can include a smoothing filter to the image in the luminance channel, e.g., averaging over a span of 20 pixels, to generate a smoothed luminance image. In some implementations, hue and saturation data of the image can also be generated by the controller.

Based on the above-noted process by the controller, the controller then performs a uniformity analysis to determine the thickness of each region of the substrate and then outputs a pass or fail indication for each substrate. In some implementations, the total number of "failing" pixels on the image representing a substrate can be calculated, and a threshold value can be determined by the user or the system to determine a substrate polishing process is failed once the total number of "failing" pixels of a substrate image is above the threshold value.

The system 100 can further include a notch finder to determine the orientation of the substrate to assist the analysis for thickness performed by the controller 190. The notch finder can by an optical system that has a scanner configured to locate the notch. The controller 190 can determine the orientation of the substrate after obtaining signals representing the location of the notch. The notch finder can be arranged within the housing 110, i.e., on the substrate holder 130, on the walking robot arm 135, or arranges as a separated component fixed inside the housing 110.

Figure 2B:
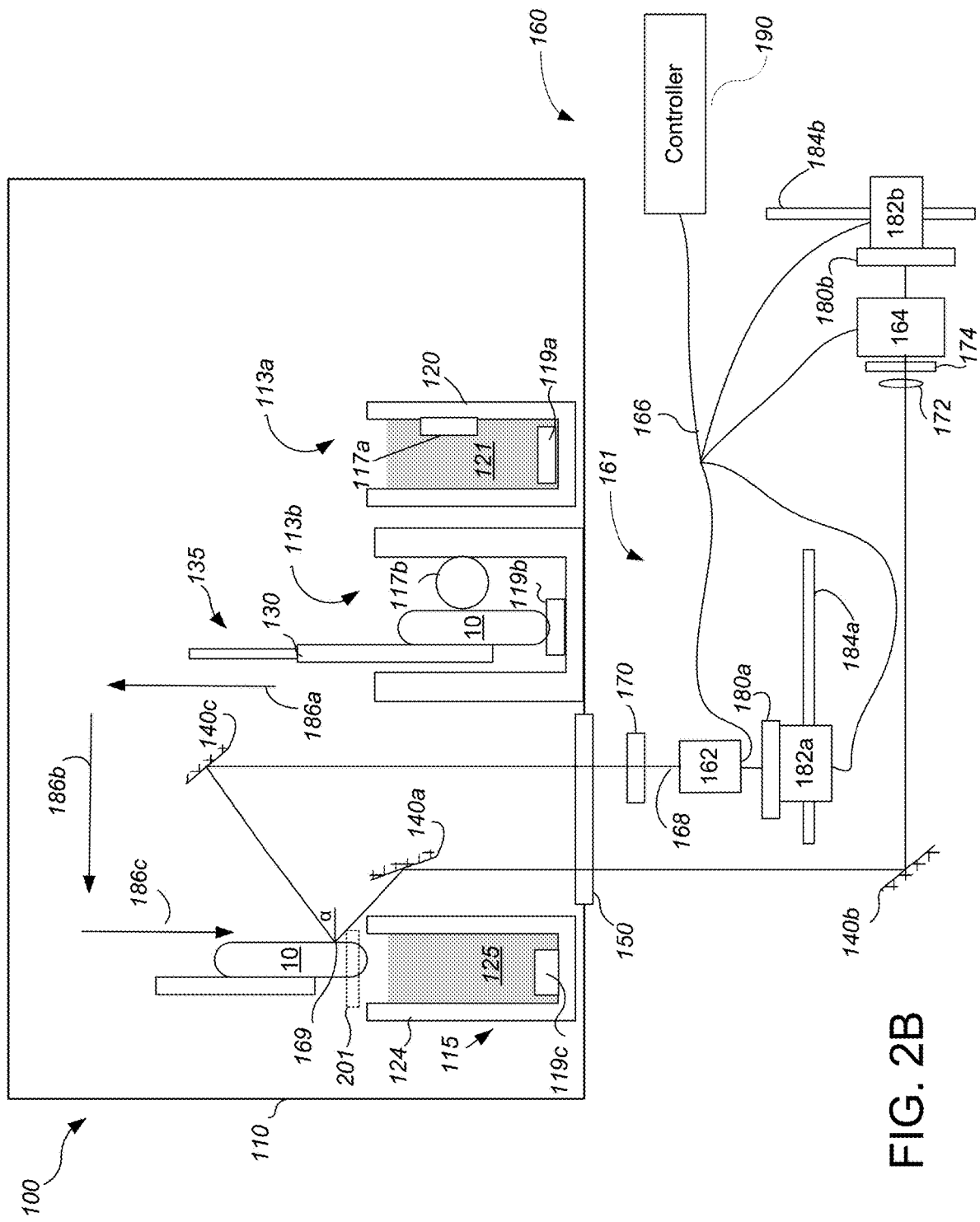
FIG. 2B illustrates a view of another example of a substrate cleaning system with an in-line optical metrology system with a movable sensor assembly and with the light source outside the chamber.

FIG. 2B illustrates a view of another example of a substrate cleaning system 100 with an in-line optical metrology system 160 with a movable sensor assembly 161 and with the light source 162 outside the chamber.

Similarly to that shown in FIG. 1B, in this configuration, both light source 162 and light detector 164 are located outside the housing 110 of the system 100. However, FIG. 2B illustrates movable stages 180a, 180b to be used as discussed above with respective to that shown in FIG. 2A.

The light path for this configuration is shown in FIG. 2B. Similarly to the light path shown in FIG. 1B, the controller 190 causes the light source 162 to emit a light beam 168 that passes through the window 150 into the housing 110. In some implementations, the light beam can pass a diffuser 170 between the light source 162 and the window 150. The first mirror 140c located inside the housing 110 reflects the light beam from the window 150 onto a position of impingement 169 of the top surface of the substrate 10 at an incidence angle α. The top surface of the substrate 10 then reflects the light beam towards the second mirror 140a located inside the housing 110. The second mirror 140a reflects the light beam after receiving it from the substrate to pass through the window 150. The third mirror 140b receives the light beam from the window 150 and reflects it into the detector 164. Then the detector 164 sends signals representing the received light beam into controller 190. In some implementations, the light beam 168 can pass associated optics 172, or polarizing filter 174, or both, between the detector 164 and the third mirror 140b. During the substrate being moved over the drier module inside the housing, the sensor assembly 161 can be held stationary on the stages 180 by the controller 190, or moving along the rails 184a or 184b with the stages 180, to scan at least a portion of regions in the substrate through the above-noted light path to determine the thickness of regions in the substrate 10.

In some implementations for measuring a thickness profile of the substrate 10 when the walking robot arm 135 is lowering down the substrate inside the cleaning chemistry of the drier module 115, the light path is in general similar to the implementations as described above, except that the light beam emitted by the light source 162 penetrates the at least partially translucent or transparent drier module shell and the cleaning chemistry after deflected by the first mirror 140a.

Even though there is only one optical metrology station shown in FIGS. 1A-2B for each cleaning system only for the ease of illustration, the total number of metrology stations for a cleaning system can be two or more. For example, if the cleaning system 100 has two tracks of cleaner modules and drier modules, thus each of the drier modules can include a separate metrology station. Alternatively, each of the drier modules can be assigned with a respective light source 162, a respective detector 164, a respective motors 182, and respective mirrors 140, and assigned with a shared or respective controller 190.

Although the window of the housing 110 is depicted at the bottom of the housing 110 as shown in FIGS. 1A-2B, the window 150 can be located anywhere on the housing consistent with the optical path. Separate windows 150a, 150b could be used for the beam from the light source 162 and the beam reflected from the substrate (as shown in FIG. 1B), or a common window 150 could be used (as shown in FIG. 2B). The detectors and light source can also be inside or outside the housing 150, depending on the size of the housing, as well as the size of sensor components. In general, the components of the sensor assembly should allow the light beam to be transmitted from the light source to the detector after being reflecting by the top surface of the substrate.

In general, data can be used to control one or more operation parameters of the CMP apparatus. Operational parameters include, for example, platen rotational velocity, substrate rotational velocity, the polishing path of the substrate, the substrate speed across the plate, the pressure exerted on the substrate, slurry composition, slurry flow rate, and temperature at the substrate surface. Operational parameters can be controlled real-time, and can be automatically adjusted without the need for further human intervention.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

However, the color image processing technique described above can be particularly useful in the context of 3D vertical NAND (VNAND) flash memory. In particular, the layer stack used in the fabrication of VNAND is so complicated that current metrology methods (e.g., Nova spectrum analysis) may be unable to perform with sufficient reliability in detecting regions of improper thickness. In contrast, the color image processing technique can have superior reliability in this application.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a non-transitory machine readable storage media, for execution by, or to control the operation of, data processing apparatus, e.g., a programmable processor, a computer, or multiple processors or computers.

Terms of relative positioning are used to denote the positioning of components of the system relative to each other, not necessarily with respect to gravity; it should be understood that the polishing surface and substrate can be held in a vertical orientation or some other orientations.

A number of implementations have been described. Nevertheless, it will be understood that various modifications may be made. For example The in-line optical metrology system 160 can also be positioned to measure a thickness profile of the substrate as the substrate is lowered into or lifted out of a cleaner module by the walking robot 135. The setup would be similar to the drier module discussed above, but with the in-line optical metrology system 160 positioned to direct the light beam to impinge the substrate a position on a path of the substrate into or out of the cleaner module. However, using a line scan as or after the substrate is removed from the drier can be superior as the substrate will be dry and thus there is less likelihood of an erroneous signal caused by liquid droplets on the substrate Rather than a line-scan camera, a camera that images the entire substrate could be used. In this case, an image of the substrate can be taken when the substrate is positioned above the drier.

The light detector can be a spectrometer rather than a color camera; the spectra data can then be reduced to the HSL color space.

The uniformity analysis step is optional. For example, the image generated by applying the threshold transformation can be fed into a feed-forward process to adjust a later processing step for the substrate, or into a feedback process to adjust the processing step for a subsequent substrate.

The position and number of mirrors described above and shown in the drawings is exemplary; there could be just one mirror, or multiple mirrors, depending on the practicalities of construction and desired optical path. Accordingly, other implementations are within the scope of the claims.

What is claimed is:

1. A substrate cleaning system, comprising:
   a cleaner module to clean a substrate after polishing of the substrate;
   a drier module to dry the substrate after the substrate is cleaned by the cleaner module, wherein the drier module comprises a tank to hold a rinse bath;
   a substrate support movable along a first axis that is substantially parallel to a face of the substrate as held by the substrate support; and
   an in-line metrology station including a line-scan camera positioned and configured to scan a portion of the substrate that is out of the rinse bath to obtain a part of an image of the substrate whilst the substrate is partially immersed in the rinse bath.

2. The substrate cleaning system of claim 1, comprising a housing to separate the cleaner module and drier module from other modules of a polishing apparatus, and a window in the housing, and wherein the line-scan camera is positioned outside the housing to scan the substrate through the window.

3. The substrate cleaning system of claim 2, comprising a first mirror positioned inside the housing and configured to reflect light from the substrate to the window.

4. The substrate cleaning system of claim 3, comprising a second mirror positioned outside the housing and configured to reflect the light from the first mirror into the line-scan camera.

5. The substrate cleaning system of claim 2, comprising a light source to generate a light beam to impinge the substrate, and wherein the line-scan camera is positioned to receive light from the light source reflected from the substrate.

6. The substrate cleaning system of claim 5, wherein the light source is configured to direct the light beam to impinge the substrate at an angle of incidence.

7. The substrate cleaning system of claim 6, wherein the angle of incidence is 5 to 85 degrees.

8. The substrate cleaning system of claim 6, wherein the light source is inside the housing.

9. The substrate cleaning system of claim 6, wherein the light source is outside the housing.

10. The substrate cleaning system of claim 9, wherein the light source is positioned to direct a light beam through the window.

11. The substrate cleaning system of claim 1, comprising a controller configured to cause a first motor to move the substrate support and to collect data from the line-scan camera while the line-scan camera remains stationary and the substrate support moves for the line-scan camera to scan across the substrate.

12. The substrate cleaning system of claim 11, comprising a second motor coupled to a light source and a third motor coupled to the line-scan camera.

13. The substrate cleaning system of claim 12, wherein the controller is configured to cause the first motor holding the substrate stationary in a vertical position outside a housing, cause the second motor moving the light source, and cause the third motor moving the line-scan camera to scan across the substrate.

14. The substrate cleaning system of claim 1, wherein the first axis is a vertical axis.

* * * * *